(12) United States Patent
Prindivill et al.

(10) Patent No.: US 6,691,406 B2
Prindivill et al.
(45) Date of Patent: Feb. 17, 2004

(54) METHODS OF DIE ATTACHMENT FOR BOC AND F/C SURFACE MOUNT

(75) Inventors: Casey L. Prindivill, Nampa, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 09/905,241

(22) Filed: Jul. 12, 2001

(65) Prior Publication Data

US 2001/0037567 A1 Nov. 8, 2001

Related U.S. Application Data

(62) Division of application No. 09/562,380, filed on May 1, 2000, now Pat. No. 6,538,898.

(51) Int. Cl.[7] .................................................. H05K 3/30
(52) U.S. Cl. ............................ 29/832; 29/840; 29/855; 257/739; 257/779; 361/764
(58) Field of Search .................... 29/832, 833, 840, 29/834, 740, 841, 854, 855, DIG. 1; 174/176, 189, 52.1; 228/178, 179.1, 180.1; 361/760, 764, 719; 257/697, 737, 739, 777–779

(56) References Cited

U.S. PATENT DOCUMENTS

| | | | |
|---|---|---|---|
| 5,296,063 A | * | 3/1994 | Yamamura et al. ............ 156/64 |
| 5,590,462 A | * | 1/1997 | Hundt et al. .................. 29/840 |
| 6,051,093 A | | 4/2000 | Tsukahara .................... 156/251 |
| 6,084,297 A | | 7/2000 | Brooks et al. ............... 257/698 |
| 6,093,969 A | | 7/2000 | Lin ............................. 257/777 |
| 6,125,043 A | * | 9/2000 | Hauer et al. ................. 361/760 |
| 6,140,707 A | | 10/2000 | Plepys et al. ................ 257/778 |
| 6,189,208 B1 | | 2/2001 | Estes et al. .................... 29/840 |
| 6,238,951 B1 | * | 5/2001 | Caillat ......................... 438/108 |
| 6,344,234 B1 | * | 2/2002 | Dalal et al. .................... 427/96 |

FOREIGN PATENT DOCUMENTS

JP          55-048943    *  4/1978   ........... H01L/21/58

* cited by examiner

Primary Examiner—Peter Vo
Assistant Examiner—Donghai D. Nguyen
(74) Attorney, Agent, or Firm—Fletcher Yoder

(57) ABSTRACT

Methods for attaching an integrated circuit die to a substrate. Specifically, substrates which are used for BOC/COB or F/C surface mounting comprise protrusions on the surface of the substrate. The protrusions are configured to form barriers to hold an adhesive paste within the barriers. An integrated circuit die is disposed on the top of the barriers and coupled to the substrate by the adhesive paste.

23 Claims, 4 Drawing Sheets

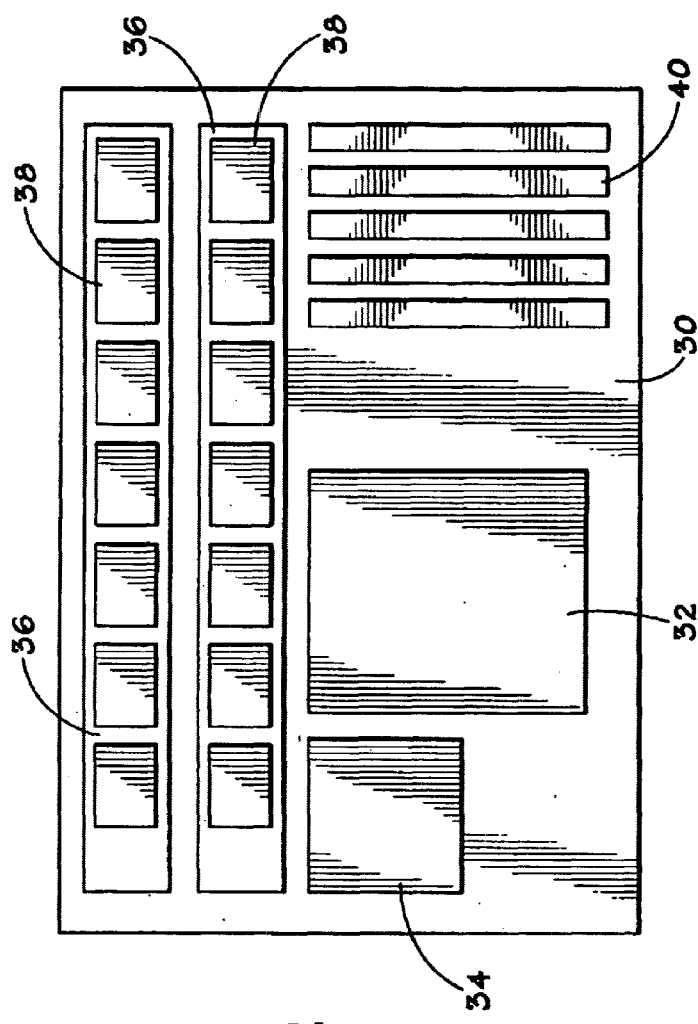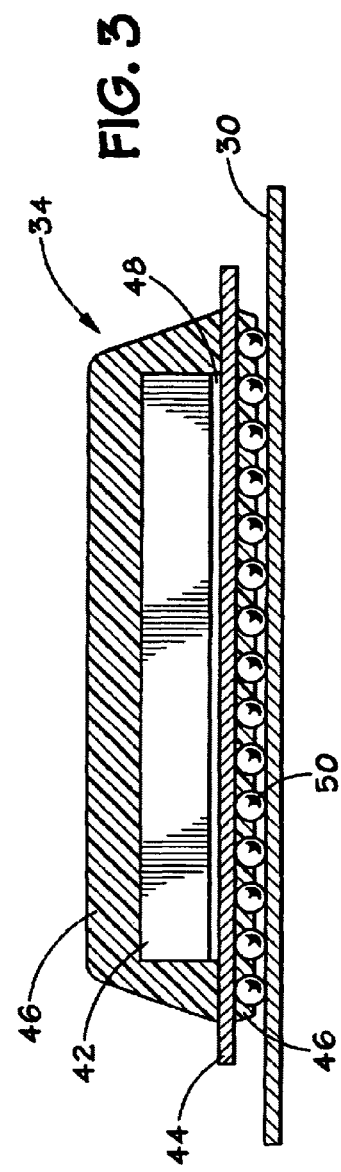

METHODS OF DIE ATTACHMENT FOR BOC AND F/C SURFACE MOUNT

This application is a divisional of application Ser. No. 09/562,380, filed on May 1, 2000 now U.S. Pat. No. 6,538,898.

BACKGROUND OF THE INVENTION

1. Field of the Invention

The present invention relates generally to semiconductor packaging and, more particularly, to a method for attaching an integrated circuit die to a substrate.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Packaging of electrical circuits is a key element in the technological development of any device containing electrical components. A single integrated circuit die is typically encapsulated within a sealed package to be mounted on a printed circuit board (PCB) or a similar apparatus for incorporation into a system. The integrated circuit die is generally encapsulated within a molding compound to protect the die from external contamination or physical damage. Because the integrated circuit die is generally encapsulated, the encapsulated integrated circuit package must also provide a system of interconnects for electrically coupling the integrated circuit die to a PCB or other external device.

Three common surface mount techniques include chip-on-board (COB), board-on-chip (BOC), and flip-chip (F/C). For COB packages, the integrated circuit die is attached to a substrate. In one type of COB package, the integrated circuit die may be attached to the substrate "face-up". That is to say that the side of integrated circuit die containing the bond pads for wire bonding the die to the substrate are left exposed on the top surface. The backside of the die, not containing the bond pads, is adhered to the substrate. In this type of package, bond wires are attached to the exposed surface of the die down to pads on the top surface of the substrate. The substrate contains electrical traces which route the signals from the top side of the substrate to the external connections.

Alternately, the integrated circuit die may be mounted on the substrate "face-down," to create a BOC package. In this instance, the substrate typically contains a slot. Since the die is mounted face-down, the bond pads on the surface of the die are arranged to correlate with the slot opening in the substrate. Bond wires are attached from the bond pads on the die, through the slot on the substrate, to the backside of the substrate. The substrate contains electrical routing to distribute electrical signals along the backside of the substrate Regardless of whether the integrated circuit die is mounted on the substrate face-up (COB) or face-down (BOC), the entire package is generally encapsulated in a molding compound. Various techniques, such as pin and array (PGA) or ball grid array (BGA), may then be incorporated to provide a means of connecting the integrated circuit package to a PCB or other external device.

For F/C packages, the integrated circuit die is mounted on the substrate face-down as described in the BOC package description above. For a F/C package, bond wires are not used to electrically couple the integrated circuit die to the substrate. Instead, solder bumps located on the face of the integrated circuit die are aligned with conductive pads on the mounting side of the substrate. The solder bumps may be reflowed to electrically couple the die to the substrate. The substrate contains electrical routing to distribute the electrical signals from the die, along the backside of the substrate. As with a BOC package, a F/C package is generally encapsulated in a molding compound, and PGA or BGA technologies may be incorporated to provide a means of connecting the integrated circuit package to a PCB or other external device.

Regardless of whether BOC or F/C packaging technology is incorporated, a key component in the packaging process is the attachment of the integrated circuit die to the substrate. One method of attaching a die to a substrate is to apply a paste to the die or the substrate and to dispose the die onto the substrate. Disadvantageously, typical paste application methods can create an inconsistent bond line, which my create die stress and eventual cracking during the automated wire-bonding. Further, inconsistent paste coverage may create voids and result in die cracking or attachment failures. Also, paste applications may result in underfill at the die edges which may result in die peeling.

Another method of attaching the integrated circuit die to the substrate is to use an adhesive tape. While tape may minimize the problems associated with current die mount techniques using paste, tape is expensive compared to paste. Tape may cost four to six times as much per part as paste, resulting in a significant increase in the price of the integrated circuit package.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present invention, there is provided a system comprising a processor and an integrated circuit package. The integrated circuit package contains a memory device which is coupled to a substrate. The substrate comprises a plurality of protrusions on its surface which are configured to form barriers to hold an adhesive paste within the barriers. The memory device is disposed on the top of the barriers and coupled to the substrate by the adhesive paste In another embodiment of the present invention, there is provided an integrated circuit package. The integrated circuit package contains an integrated circuit device which is coupled to a substrate. The substrate comprises a plurality of protrusions on its surface which are configured to form barriers to hold an adhesive paste within the barriers. The integrated circuit device is disposed on the top of the barriers and coupled to the substrate by the adhesive paste.

In another embodiment of the present invention, there is provided a substrate. The substrate comprises a plurality of protrusions on its surface which are configured to form barriers to hold an adhesive paste within the barriers. An integrated circuit device may be disposed on the top of the barriers and coupled to the substrate by the adhesive paste.

In yet another embodiment of the present invention, there is provided a method of attaching an integrated circuit device to a substrate. The method comprises the acts of providing a substrate, forming a plurality of walls on the substrate, dispensing an adhesive material within the walls of the substrate, and disposing an integrated circuit device on the top of the walls.

In still another embodiment of the present invention, there is provided another method of attaching an integrated circuit device to a substrate. The method comprises the acts of providing a substrate, the substrate comprising a plurality of walls, dispensing an adhesive material within the walls of the substrate, and disposing and integrated circuit device on the top of the walls.

DESCRIPTION OF THE DRAWINGS

The foregoing and other advantages of the invention will become apparent upon reading the following detailed description and upon reference to the drawings in which

FIG. 2 illustrates a plan view of a circuit board having various devices employed thereon;

FIG. 3 illustrates a cross-section of a BGA device attached to a circuit board;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
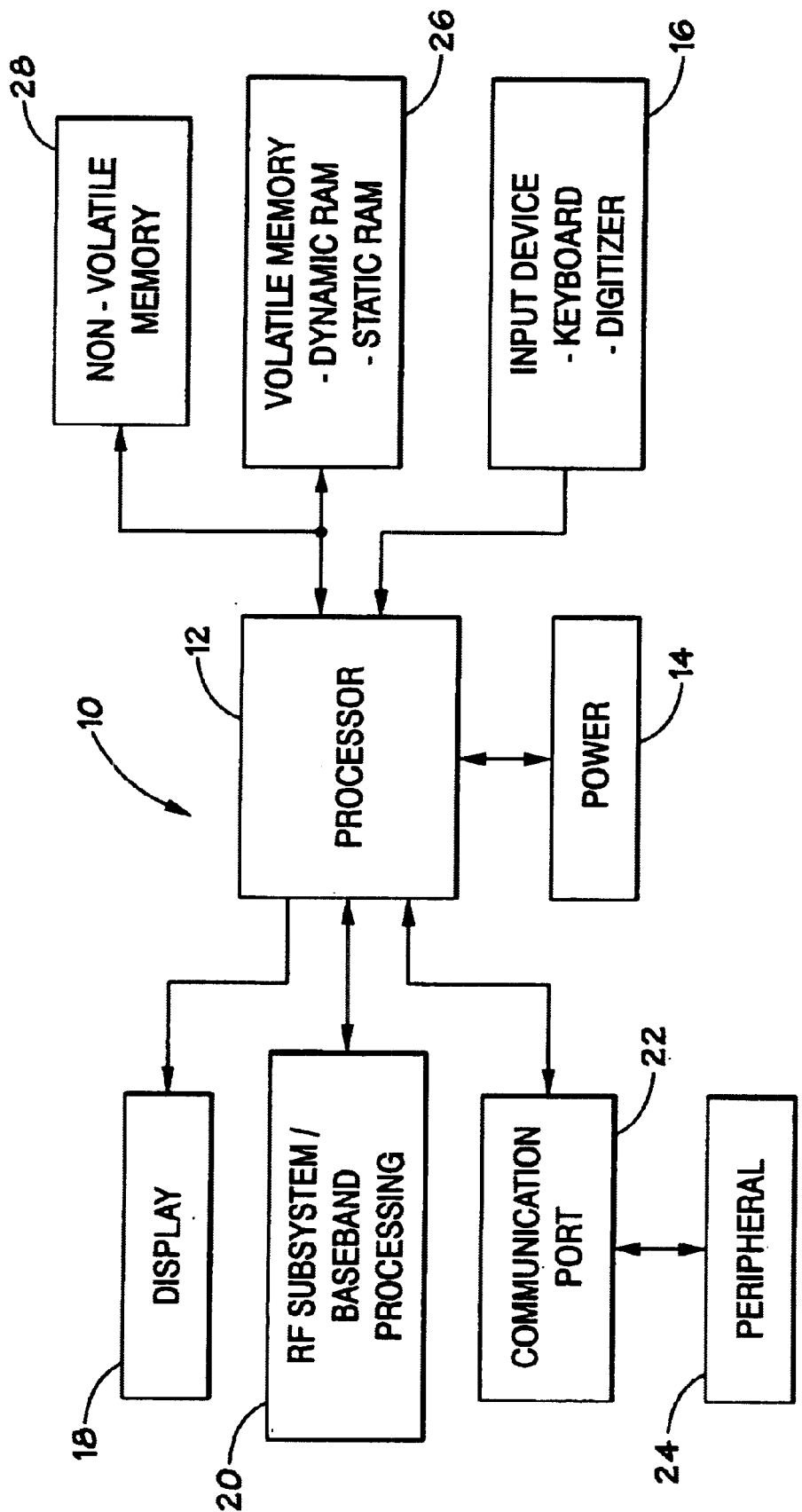
FIG. 1 illustrates a block diagram of an exemplary processor-based device in accordance with the present invention.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a signal processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM) The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory Referring to FIG. 2, a circuit board 30, such as a PCB, is shown having various devices and connections coupled to its surface. A microprocessor 32 is shown along with a ROM device 34 and a set of memory modules 36, each containing a plurality of RAM chips 38. A plurality of connections or ports 40 are also located on the circuit board 30 allowing for connection to various peripheral devices and expansion modules. In a computer application, for example, such peripheral devices and expansion modules might include sound cards, video cards, additional memory modules or connections for input and output peripherals. While the present embodiment has a direct relation to memory chips such as the ROM device 34 and RAM chip 38, the invention as described below herein, may be applied to any device package having similar mounting characteristics including, if desired, the microprocessor 32.

Referring to FIG. 3, ROM device 34 is depicted as a typical BGA device. The BGA device includes a chip or die 42 adhered to a substrate 44. The die is an integrated circuit device typically having a plurality of transistors, capacitors, and/or electrical connections. Die 42 is attached to substrate 44 by adhesive 48. The adhesive 48 in this particular illustration is tape.

To protect the die 42 from external elements such as moisture, dust, or impact, the die 42 is advantageously encapsulated in a molding compound 46. The molding compound 46 is typically a resin. The molding compound 46 is also disposed on the backside of the substrate 44 to protect bond wire connections (not shown) between the die 42 and substrate 44. The molding compound 46 on the backside of substrate 44 will also reduce bowing of the substrate 44 caused by the molding compound 46 on the frontside of the substrate 44.

A plurality of conductive balls 50 are arranged in an array on the surface of the substrate opposite the die 42. The conductive balls 50 are typically comprised of solder. The conductive balls 50 provide a conductive path from the circuit board 30 to the substrate 44. The conductive balls 50 are attached to pads (not shown) on the backside of the substrate 44. The substrate 44 is electrically coupled to the die 42 by bond wires (not shown). The device 34 is placed onto a circuit board 30 having bond pads (not shown). The bond pads are arranged to mirror the array pattern of the conductive balls 50. The device 34 is attached to the circuit board 30 by reflowing the solder to create an electrical connection between the conductive balls 50 and the bond pads of the circuit board 30.

Figure 4:
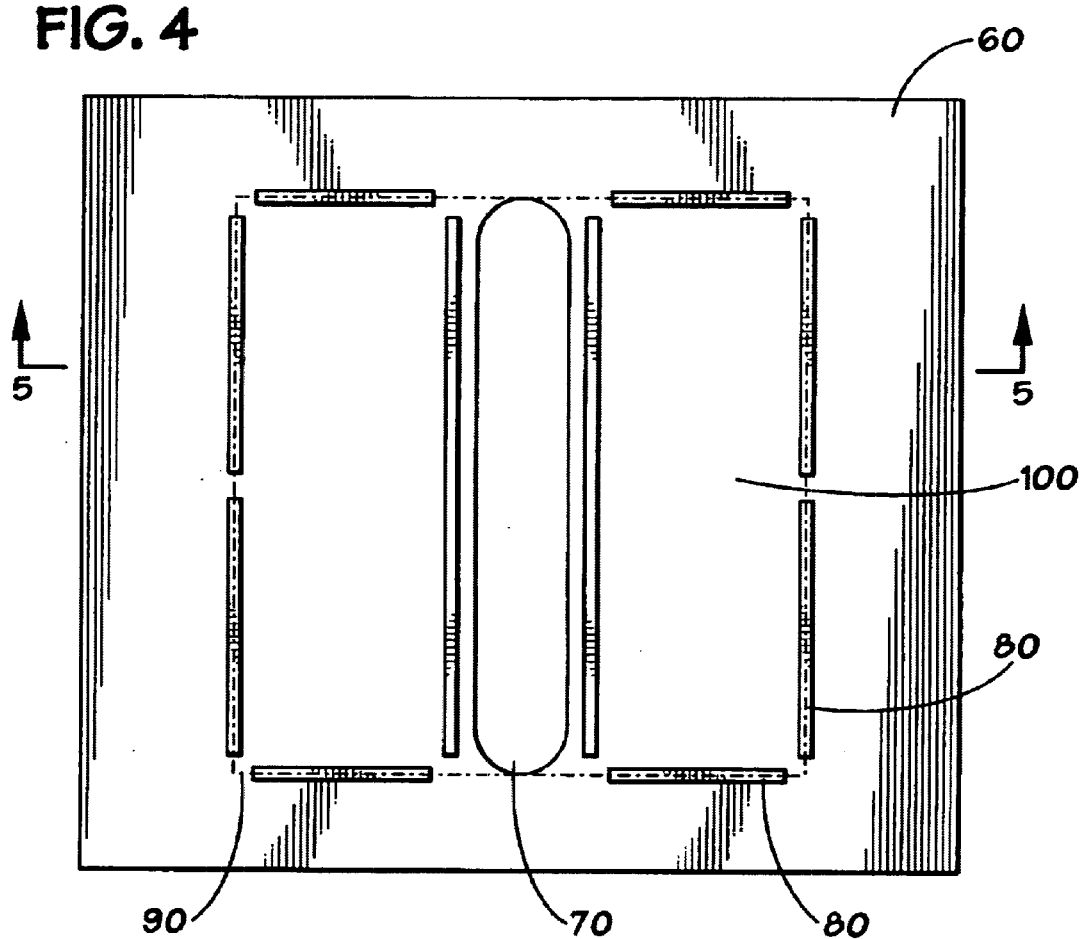
FIG. 4 illustrates a frontside plan view of a BOC substrate in accordance with the present invention.

FIG. 4 illustrates a plan view of a BOC substrate 60. The substrate 60 contains slot 70 through which bond wires may pass to electrically couple an integrated circuit die (illustrated by phantom line 90) to the substrate 60 to form an integrated circuit package. The substrate 60 comprises a plurality of walls 80. In one embodiment, the walls may be comprised of a layer of copper and/or a layer of solder mask. The walls 80 may be configured such that an integrated circuit die may be disposed on top of the walls 80. Advantageously, the configuration of the walls 80 may allow the integrated circuit die to be deposited so that the edges of the die are roughly centered on the peripheral walls 80 of the substrate 60. The walls 80 are also advantageously configured to provide vents 100 through which excess paste may flow, as discussed below, herein.

Figure 5:
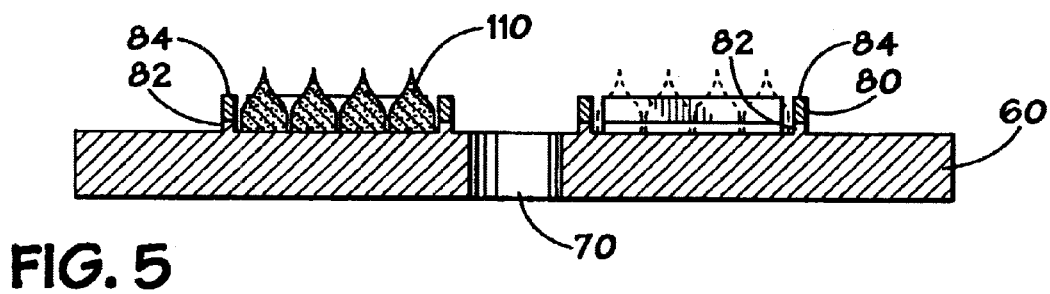
FIG. 5 illustrates a cross-section of the BOC substrate taken along line 5—5.

FIG. 5 illustrates a cross-section of the substrate 60 taken along line 5—5 The substrate 60 contains slot 70 to permit bond wires (not shown) to electrically couple an integrated circuit die (not shown) to the backside of the substrate 60. In one embodiment, the wall 80 is comprised of a bottom layer of copper 82 and a top layer of soldermask 84. The copper may be disposed on the substrate 60 at a thickness of around 0.5 mils. Soldermask may then be disposed on top of the copper at a thickness of about 1.0 mil. Thus, the wall height in this embodiment would be about 1.5 mils. Various materials and thicknesses may be used to provide an overall wall height of 0.5–5.0 mils, such as polymers and metals (including solder mask and copper).

A paste 110 may be disposed onto the substrate 60 within the perimeter of the walls 80. One method of dispensing the paste 110 is an automated dispenser which dispenses the paste 110, as shown in FIG. 5. Alternately, the paste 110 may be screen printed onto the substrate 60. The paste 110 is printed within the boundaries of the walls 80.

Figure 6:
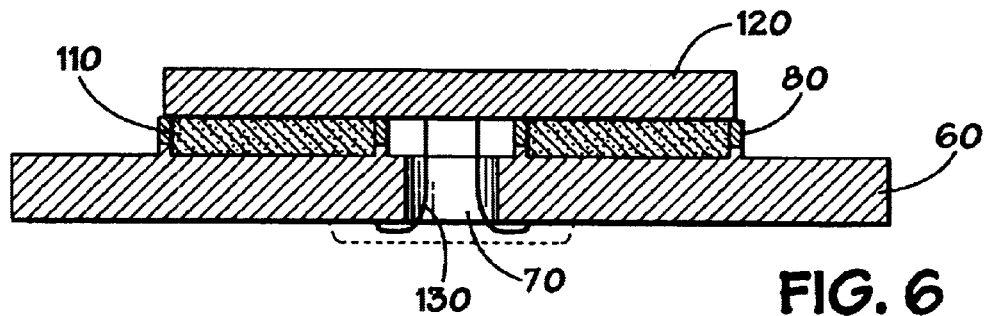
FIG. 6 illustrates the cross-section shown in FIG. 5 with an integrated circuit die attached to the substrate.

FIG. 6 illustrates the cross-section shown in FIG. 5 with an integrated circuit die 120 attached to the substrate 60. As shown, the integrated circuit die 120 is disposed to rest on the top of the walls 80. The paste 110 ensures that the integrated circuit die 120 is securely attached to the substrate 60. The integrated circuit die 120 is advantageously firmly pressed onto the tops of the walls 80. It should be noted that the paste 110 is dispensed in such a way that the paste 110 is higher at certain points than the walls 80. Thus, when the integrated circuit die 120 is pressed onto the tops of the walls 80, the paste 110 is forced down into the reservoir formed by the boundaries of the walls 80 The paste may completely fill the reservoir between the boundaries of the walls 80, and any excess paste 110 may flow through the vents 100 shown in FIG. 4.

Advantageously, this method provides consistent void-free coverage of the adhesive material and provide a consistent bond line. Because the height of the walls 80 is easily controlled, the integrated circuit die 120 can be dispensed onto the substrate 60 in a uniform and consistent manner such that the integrated circuit die 120 is parallel to the substrate surface 60. Unlike using an adhesive tape, this method of die attachment produces consistent and reliable bond heights, since the die height is no longer affected by the adhesive used to attach the integrated circuit die 120 to a substrate. Thus, the automated bonder, which is used to attach bond wires 130, will have no problem in determining the exact location of the substrate 60 in relation to the integrated circuit die 120. The consistent void-free coverage and the consistent bond line reduces overall package stress and mitigates cracking, as well as reducing any underpeeling that may result.

The method of BOC attachment discussed above also has several advantages over the common method of attachment used in BOC packages, i.e., the use of adhesive tape. Since the walls on the substrate 60 define the height of the integrated circuit die 120, and thus define the overall height of the integrated circuit package, the package dimensions can be more accurately defined. Tape is generally about four times thicker than the walls 80 depicted in this exemplary embodiment. Thus, the overall package height is less than the height would have been had tape been used to attach the integrated circuit die 120 to a substrate. Smaller integrated circuit packages are generally desirable since geographic spacing of components generally limits the amount of components that can be placed in a system. The consistency provided by the walls 80 on the substrate 60 also provides for less processing problems than if tape were used to attach the integrated circuit die 120 to a substrate. The thickness of the tape may vary depending on how much downward force is placed on the integrated circuit die 120 during attachment. Further, the thickness of the tape may change during processing. This change may not be consistent from package to package or from one point on a single package to another point on a single package.

Figure 7:
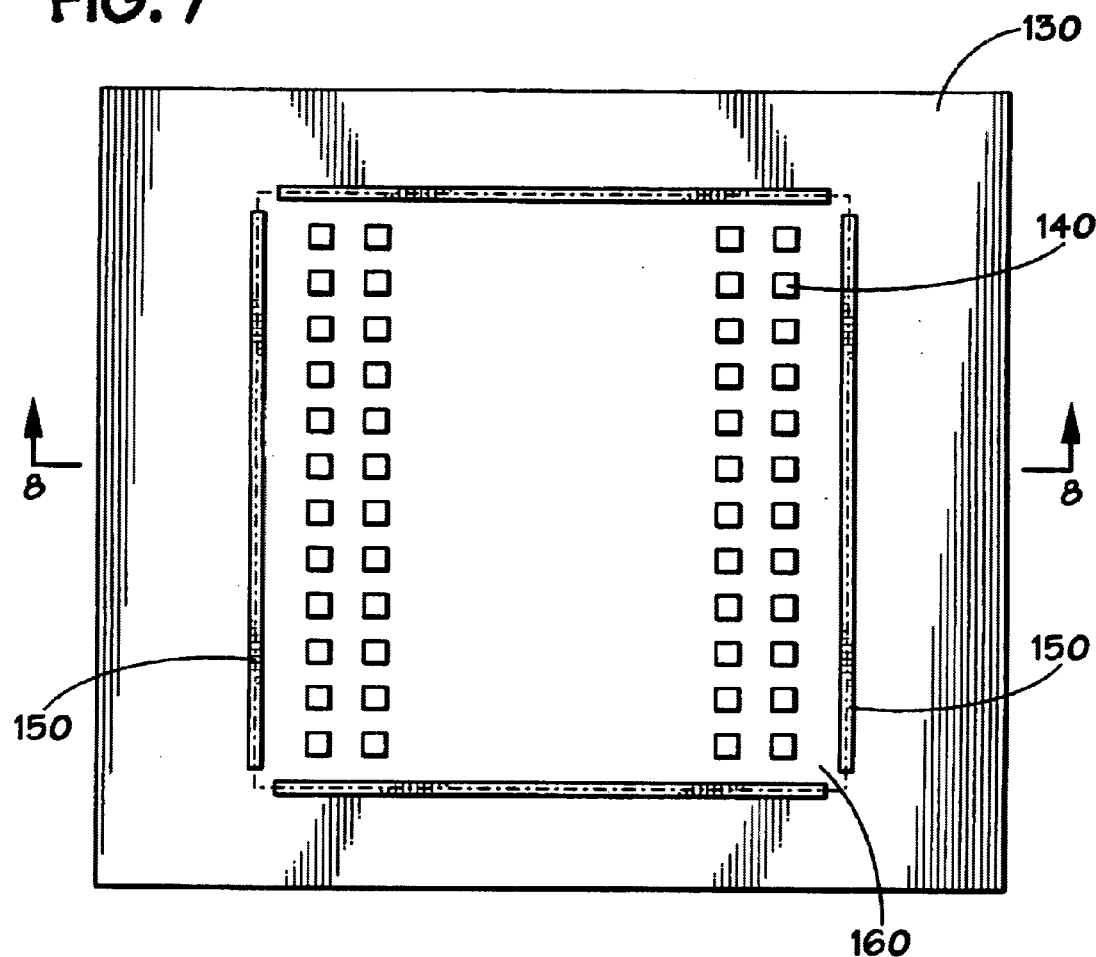
FIG. 7 illustrates a top plane view of an alternate embodiment of the present invention which uses a F/C substrate.
Figure 8:
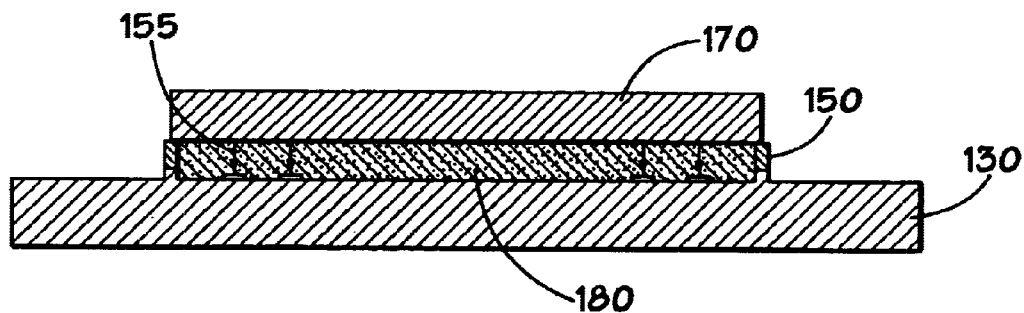
FIG. 8 illustrates a cross-section of the substrate shown in FIG. 7 taken along 8—8

FIG. 7 illustrates a top plan view of an alternate embodiment of the present invention. Here, the substrate 130 is configured to be used for F/C surface mounting techniques. Conductive pads 140 on the frontside of the substrate 130 are illustrated. Unlike the slotted BOC embodiment in which conductive pads are located on the backside, the conductive pads 140 are arranged on the frontside of the substrate 130 and configured to align with conductive pads on the surface of an integrated circuit die (not shown). As illustrated in FIG. 8, an integrated circuit die is placed upon the top of walls 150 which may be arranged to provide a reservoir to hold an anistropic paste. An anistropic paste provides electrical conductivity in only the z-direction depicted by the arrow 155. Thus, the anistropic paste provides for the electrical coupling of the conductive pads of the integrated circuit die to the respective conductive pads 140 of the substrate 130. The substrate 130 also contains electrical routing to route the electrical signals from the pads 140 on the frontside of the substrate 130 to pads (not shown) on the backside of the substrate 130 to electrically couple the integrated circuit package to a circuit board or other external device.

The substrate 130 contains walls 150 which are arranged to create a reservoir to hold the paste. The walls create a perimeter with vents 160 to provide relief for excess paste flow. FIG. 8 also illustrates an integrated circuit die 170 disposed on top of the walls 150 and attached to the substrate 130 by an anistropic paste 180.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of attaching an integrated circuit device to a substrate comprising:
   providing a substrate;
   forming a plurality of walls on the substrate, the plurality of walls being configured to create one or more reservoirs on the substrate;
   dispensing an adhesive material within the one or more reservoirs in such a way that the adhesive material is in contact with the walls of the one or more reservoirs and at least a portion of the adhesive material is higher than the walls of the one or more reservoirs; and
   disposing an integrated circuit device on top of the walls of the one or more reservoirs.

2. The method, as set forth in claim 1, wherein forming the plurality of walls comprises dispensing at least one of copper and soldermask onto the substrate.

3. The method, as set forth in claim 1, wherein forming the plurality of walls comprises dispensing at least one of a polymer and a metal.

4. The method, as set forth in claim 1, wherein dispensing the adhesive material comprises dispensing a paste within the one or more reservoirs.

5. The method, as set forth in claim 1, wherein dispensing the integrated circuit device comprises disposing a memory device on top of the walls of the one or more reservoirs.

6. The method, as set forth in claim 1, wherein the method is performed in the recited order.

7. A method of attaching an integrated circuit device to a substrate comprising:
   providing a substrate having a plurality of walls arranged to support a die and being configured to create one or more reservoirs on the substrate;
   dispensing an adhesive material within the one or more reservoirs in such a way that the adhesive material is in contact with the walls of the one or more reservoirs and at least a portion of the adhesive material is higher than the walls of the one or more reservoirs; and
   disposing an integrated circuit device on top of the walls of the one or more reservoirs.

8. The method, as set forth in claim 7, wherein dispensing the adhesive material comprises dispensing a paste within the one or more reservoirs.

9. The method, as set forth in claim 7, wherein disposing the integrated circuit device comprises disposing a memory device on top of the walls of the one or more reservoirs.

10. The method, as set forth in claim 7, wherein disposing the integrated circuit device comprises forcing the integrated circuit device on the plurality of walls of the one or more reservoirs to form a consistent bond line between the integrated circuit and the substrate.

11. The method, as set forth in claim 7, wherein disposing the integrated circuit device comprises venting excess adhesive material from the one or more reservoirs.

12. The method, as set forth in claim 7, wherein disposing the integrated circuit device comprises dispensing an adhesive material within the one or more reservoirs to completely fill the one or more reservoirs to a thickness at least as high as the plurality of walls.

13. The method, as set forth in claim 7, wherein the method is performed in the recited order.

14. A method of attaching an integrated circuit device to a substrate comprising:
   providing a substrate;
   creating a plurality of protrusions on the substrate, the plurality of protrusions being configured to provide a perimeter that forms a plurality of reservoirs on the substrate;
   dispensing an adhesive material within the plurality of reservoirs, wherein the adhesive material is in contact with the walls of the one or more reservoirs and at least a portion of the adhesive material is higher than the plurality of protrusions; and
   disposing an integrated circuit device on top of the plurality of protrusions.

15. The method, as set forth in claim 14, wherein creating the plurality of protrusions comprises disposing copper onto the substrate.

16. The method, as set forth in claim 15, wherein creating the plurality of protrusions comprises disposing a soldermask onto the copper.

17. The method, as set forth in claim 16, wherein creating the plurality of protrusions comprises forming the plurality of protrusions to a height in the range of about 0.5 to about 5.0 mils.

18. The method, as set forth in claim 14, wherein dispensing the adhesive material comprises dispensing a paste within the plurality of reservoirs.

19. The method, as set forth in claim 18, wherein dispensing the paste comprises utilizing an automated dispenser to dispose the paste within the plurality of reservoirs.

20. The method, as set forth in claim 18, wherein dispensing the paste comprises utilizing a screen to dispose the paste within the plurality of reservoirs.

21. The method, as set forth in claim 14, wherein dispensing the adhesive material comprises applying a force to the integrated circuit device on the plurality of protrusions to form a consistent bond line between the integrated circuit and the substrate.

22. The method, as set forth in claim 14, wherein dispensing the adhesive material comprises venting excess adhesive material from the plurality of reservoirs.

23. The method, as set forth in claim 14, wherein the method is performed in the recited order.

* * * * *